United States Patent [19]

Wyland

[11] Patent Number: 5,261,064
[45] Date of Patent: Nov. 9, 1993

[54] BURST ACCESS MEMORY

[75] Inventor: David C. Wyland, San Jose, Calif.

[73] Assignee: Advanced Micro Devices, Inc., Sunnyvale, Calif.

[21] Appl. No.: 940,744

[22] Filed: Sep. 8, 1992

Related U.S. Application Data

[63] Continuation of Ser. No. 416,680, Oct. 3, 1989, abandoned.

[51] Int. Cl.[5] .............................................. G06F 12/00
[52] U.S. Cl. .............................. 395/400; 364/DIG. 1; 364/239.51; 364/243; 364/243.6; 364/246; 364/246.4; 364/251; 364/260
[58] Field of Search .............................. 395/400, 425; 365/230.03, 230.04, 230.05, 230.09, 189.04, 230.01, 220, 221

[56] References Cited

U.S. PATENT DOCUMENTS

| | | | |
|---|---|---|---|
| 4,120,048 | 10/1978 | Fuhrman | 365/239 |
| 4,410,964 | 10/1983 | Nordling et al. | 365/220 |
| 4,698,753 | 10/1987 | Hubbins et al. | 364/200 |
| 4,849,937 | 7/1989 | Yoshimoto | 365/189.05 |
| 4,891,788 | 1/1990 | Kreifels | 365/49 |
| 4,933,846 | 6/1990 | Humphrey et al. | 364/200 |
| 4,933,909 | 6/1990 | Cushing et al. | 365/230.05 |
| 4,947,373 | 8/1990 | Yamaguchi et al. | 365/189.04 |
| 5,202,856 | 4/1993 | Glider et al. | 365/230.05 |

FOREIGN PATENT DOCUMENTS 0167185 10/1982 Japan .
0182587 9/1985 Japan .

OTHER PUBLICATIONS

"Increased Data Read Rate from Memories", *IBM Technical Disclosure Bulletin*, vol. 30, No. 12, May 1988, pp. 339–341.

Hayes, John P., *Computer Architecture and Organization*, McGraw-Hill Book Company, 1978, pp. 244–249.

*Primary Examiner*—Rebecca L. Rudolph
*Attorney, Agent, or Firm*—Foley & Lardner

[57] ABSTRACT

A high speed dual-port burst access memory (BAM) is disclosed that is capable of operating in both a burst access mode and random access mode simultaneously. The architecture of the high speed BAM permits random or burst access read or write operations on one port while simultaneously supporting sequential reading or writing in a burst or random mode of operation on a second port. Burst access can also be stopped and restarted for any number of clock cycles independently at each port. The BAM can also be configured as a high speed FIFO.

18 Claims, 13 Drawing Sheets

| BAM PHASE FF TRUTH TABLE | | | | | | | |
|---|---|---|---|---|---|---|---|
| $\overline{LAA}$ | $\overline{LAB}$ | $\overline{BEA}$ | $\overline{BEB}$ | $\overline{WR}$ | Q | Q+1 | NOTES |
| H | H | X | X | X | Q | $\overline{Q}$ | NORMAL OPERATION |
| L | H | X | L | X | Q | $\overline{Q}$ | READ OR WRITE A, BURST ON B |
| H | L | L | X | X | Q | $\overline{Q}$ | READ OR WRITE B, BURST ON A |
| L | H | X | H | H | Q | AO | READ A, NO BURST ON B |
| H | L | H | X | H | Q | $\overline{AO}$ | READ B, NO BURST ON A |
| L | H | X | H | H | Q | $\overline{AO}$ | WRITE A, NO BURST ON B |
| H | L | H | X | H | Q | AO | WRITE B, NO BURST ON A |

| FUNCTION | SEQUENTIAL READ | SEQUENTIAL WRITE | COMMENTS |
|---|---|---|---|
| FIFO WRITE | MATCH * $\overline{\text{FULL}}$ | BE | CLOCK DATA INTO FIFO |
| FIFO READ | BE | MATCH * $\overline{\text{EMPTY}}$ | ONLY AFFECTS FC |
| FC INCREMENT | MATCH * $\overline{\text{FULL}}$ * $\overline{\text{BE}}$ | BE * $\overline{\text{MATCH}}$ | FIFO WRITE WITHOUT READ |
| FC DECREMENT | BE * $\overline{\text{MATCH}}$ | MATCH * $\overline{\text{EMPTY}}$ * $\overline{\text{BE}}$ | FIFO READ WITHOUT WRITE |
| ADDRS INCREMENT | MATCH * $\overline{\text{FULL}}$ * $\overline{\text{BE}}$ | MATCH * $\overline{\text{EMPTY}}$ * $\overline{\text{BE}}$ | |
| RAM WRITE | - - - | MATCH * $\overline{\text{EMPTY}}$ * $\overline{\text{BE}}$ | ADDRS INCR = RAM WRITE |

NOTE THAT THE FC COUNTER MOST SIGNIFICANT BIT CORRESPONDS TO FIFO FULL, i.e. FC = 2.

MATCH IS ACTIVE WHEN THE RAM (EVEN OR ODD) FOR THE GIVEN PORT MATCHES THE ADDRESS COUNTER LSB FOR THAT PORT. MATCH IS THEREFORE EQUAL TO THE EXCLUSIVE OR OF THE ADDRESS COUNTER LEAST SIGNIFICANT BIT AND THE A/B PHASE F.F.

BURST ACCESS MEMORY

This application is a continuation of application Ser. No. 07/416,680, filed Oct. 3, 1989, now abandoned.

BACKGROUND OF THE INVENTION

The invention is related in general to memory devices. In particular, the invention is related to memory devices capable of operating in a burst access mode, wherein sequential data can be transferred to and from the memory device at the rate of one word per clock cycle.

Advances in the art of microprocessor technology have led to the development of so-called "burst mode" devices in order to increase overall system performance. Burst mode devices, for example the AMD 29000 RISC processor and the Motorola 68030, are processors capable of supporting a burst mode memory read or write operation, wherein sequential data words are transferred to and from a memory device without requiring the processor to provide a read or write address for each data word. More specifically, the processor need only supply a single starting address to the memory device in a burst access mode. Thereafter, the address count is incremented by the memory device in order to sequentially write to or read from a plurality of address locations within the memory device. Higher system performance can therefore be attained as the processor is not required to provide the address location for each data word to be transferred.

In addition to operating in a burst access mode, it is desirable that the memory device be randomly accessible so that data can be stored at and retrieved from nonsequential address locations, preferably at the same time a burst access mode operation is being performed. The two modes of operation can be accommodated simultaneously if a dual-port memory device is provided, i.e., a dual-port RAM capable of performing a random access read or write operation on one port while simultaneously reading or writing sequential data in a burst mode on a second port.

Implementation of a burst access memory (hereinafter BAM) capable of both random access and burst mode operation as described above could possibly be accomplished with current state of the art dual-port RAMs. Dual-port RAMs, however, have disadvantages which limit their applicability to a commercially viable BAM. For example, dual-port RAMs are more expensive, more difficult to manufacture, and have lower densities as compared to single-port RAMs. Current single port RAM cells are half the size of current dual-port RAM cells, and current single-port memory array densities are generally a generation ahead (4×density) of current dual-port memory arrays. As it is unlikely that future advances in dual-port technology will ever eclipse advances in single-port technology, single-port memory arrays will most likely always maintain the advantages over dual-port memory arrays listed above.

Accordingly, it would be desirable to provide a BAM having the advantages of a single-port memory array described above that could operate in both a burst access mode and a random access mode simultaneously. In addition, it would be desirable to provide a BAM that could provide both burst access mode and random access mode at high operating speeds (on the order of 50 MHz) to support high speed processors such as the AMD 29000 at 33 MIPs.

SUMMARY OF THE INVENTION

The invention provides a high speed BAM that is capable of operating in both a burst access mode and random access mode simultaneously. More specifically, the architecture of the high speed BAM provides the advantages associated with single-port memory arrays, such as higher densities and lower manufacturing costs, while at the same time operating as a dual-port device to thereby permit burst or random access read or write operations on one port while simultaneously supporting sequential reading or writing in a burst or random mode of operation on a second port. Burst access can be stopped and restarted for any number of cycles independently at each port. The BAM is capable of operating at speeds on the order of 50 MHz, and providing one memory access per clock cycle. The BAM can also be configured as a high speed FIFO, using external logic or implementing internal logic to arrive at an integrated monolithic FIFO device.

BRIEF DESCRIPTION OF THE DRAWINGS

With the above as background, reference should now be made to the detailed description of the preferred embodiments and the drawings in which.

DETAILED DESCRIPTION OF PREFERRED EMBODIMENTS

Figure 1:
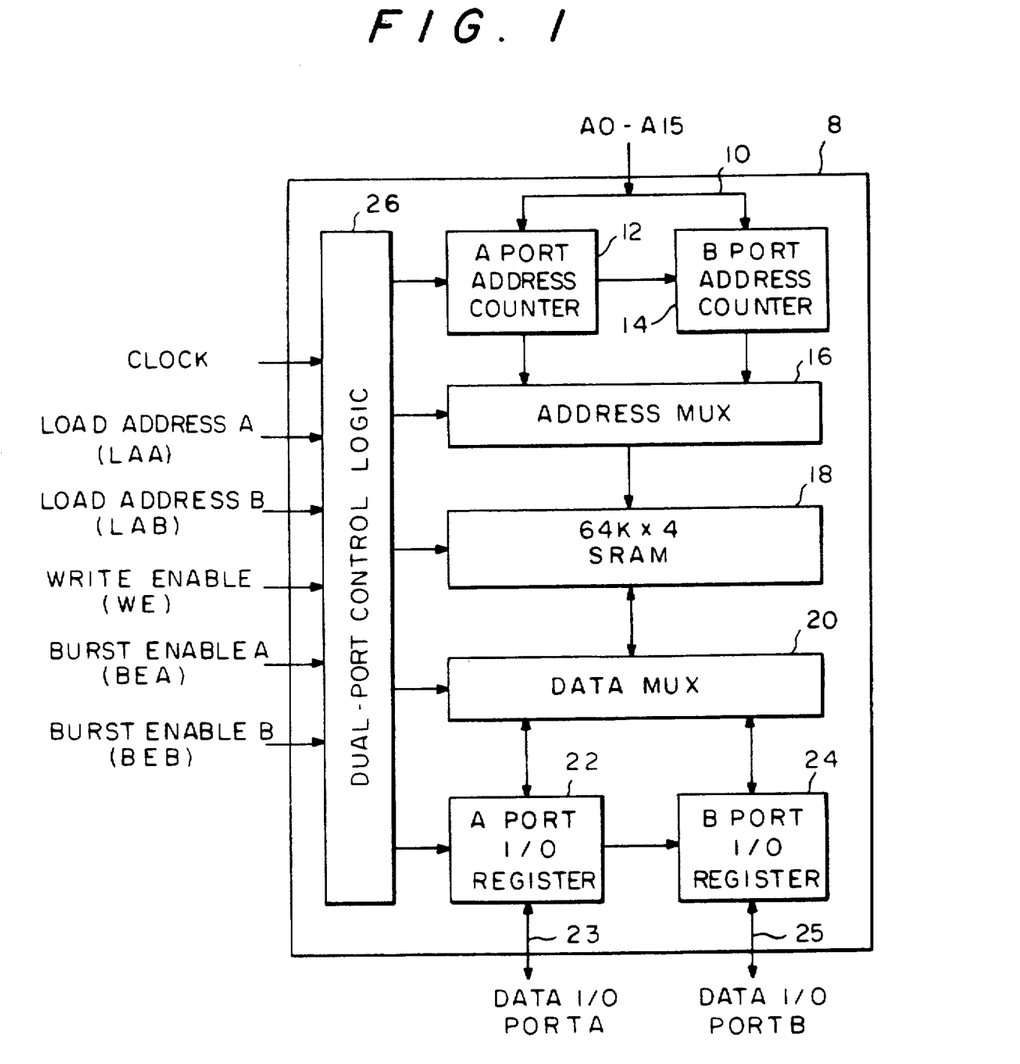
FIG. 1 is a conceptual block diagram of a BAM in accordance with a first embodiment of the invention.

Referring now to FIG. 1, a dual-port BAM 8 is shown including a sixteen bit address bus 10, A port and B port address counters 12 and 14, an address MUX unit 16, a 64K × 4 SRAM memory array 18, a data MUX unit 20, A port and B port data I/O registers 22 and 24, and A and B port data busses 23 and 25. The overall operation of the dual-port BAM 8 is controlled by a dual-port control logic circuit 26 having a plurality of control inputs for receiving external control signals from a processor (not shown) which include: a Load Address A (LAA) signal input; a Load Address B (LAB) signal input; a Write Enable (WE) signal input; a Burst Enable A (BEA) signal input; and a Burst Enable B (BEB) signal input.

In operation, the contents of the address bus 10 are loaded into either the A port address counter 12 or the B port address counter 14 when LAA or LAB is enabled. The I/O registers 22 and 24 include a read/write enable latch (not shown) and the state of the WE input is loaded into a read/write enable latch for the selected port to select either a data read or data write operation. Data transfers are enabled by the burst enable inputs BEA and BEB.

For example, if the A port I/O register 22 has been set for a read operation, the activation of BEA will cause data at the current address counter value loaded in the A port address counter 12 to be provided to the A port data bus 23 via the output MUX 20. The A port address counter 12 is then incremented by the rising edge of the clock signal supplied to the clock input. Alternatively, if the A port I/O register 22 has been set for a write operation, the activation of BEA will cause data on the A port data bus 23 to be clocked into the memory array 18 at the address location specified by the current address counter value stored in the A port address counter 12. The A port address counter 12 is again incremented by the rising edge of the clock signal supplied to the clock input. Thus, in either a read or write operation, the dual-port BAM 8 provides a burst access mode of operation as only the initial starting address of the data transfer need be loaded into the A port address counter 12.

The BAM 8 also permits random access read or write operations to the memory array 18 to directly address a particular address location. In a random access mode of operation, the burst enable input corresponding to the desired port is enabled for a single transfer operation.

The architecture of the BAM 8 described above permits one memory access for each port every two clock cycles. Burst mode access speed can be improved, however, by taking advantage of the fact that burst mode access is addressing sequential locations in the memory array. Thus, an interleaving scheme can be employed for the memory array so that one port is addressing one section of memory while the second port is addressing a different section of memory as is illustrated in FIG. 2.

Figure 2:
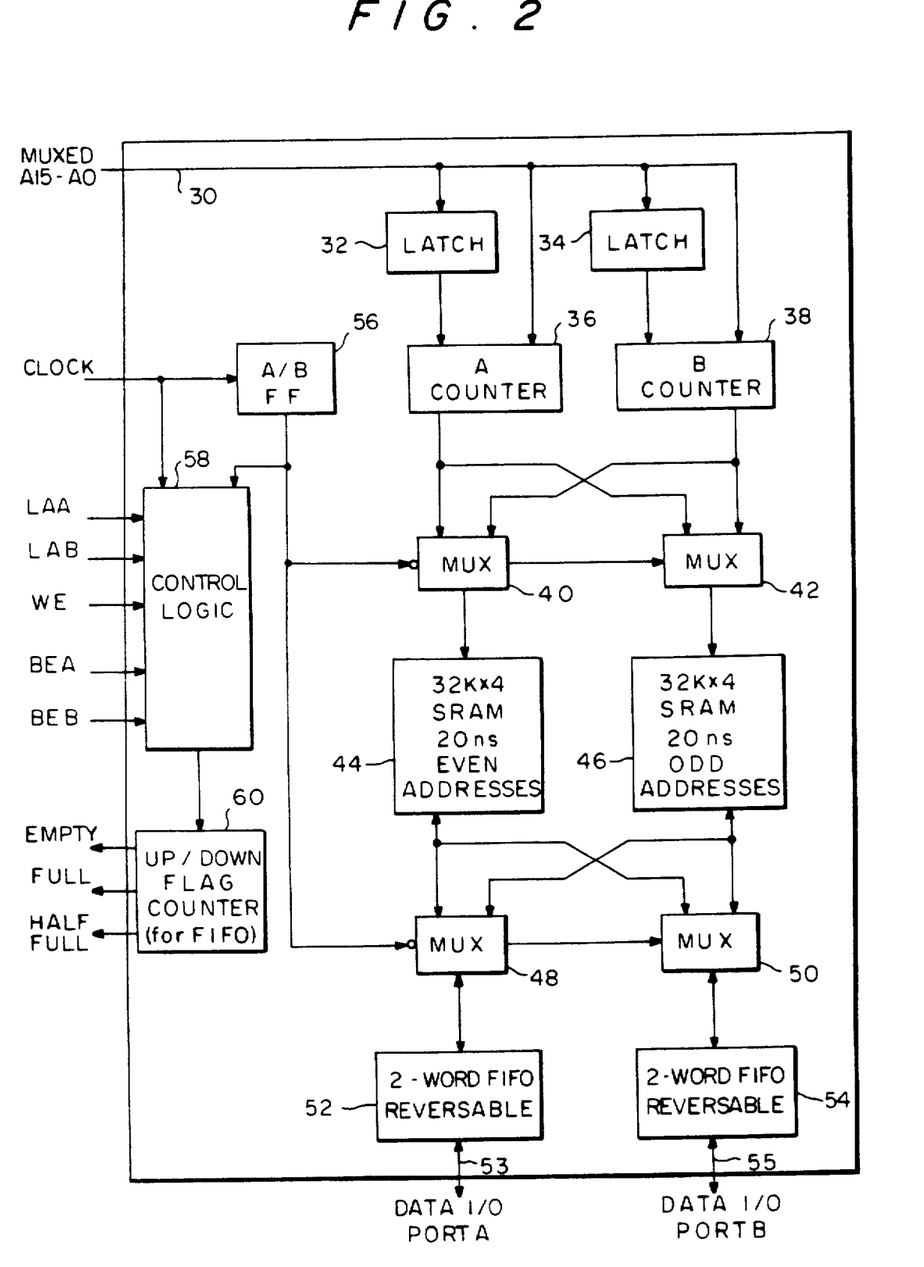
FIG. 2 is a schematic block diagram of a BAM in accordance with a second embodiment of the invention.

A BAM is shown in FIG. 2 including a multiplexed address bus 30, A and B port address latches 32 and 34, A and B port address counters 36 and 38, A and B port address MUX units 40 and 42, a 32K × 4 SRAM array 44 designated for even addresses, a 32K × 4 SRAM array 46 designated for odd addresses, A and B port data MUX units 48 and 50, A and B port reversible FIFOs 52 and 54, A and B port data busses 53 and 55, a phase flip-flop (FF) 56, control logic circuit 58, and an Up/Down counter 60.

The multiplexing of the address bus 30 provides for sixteen bit addressing using only an eight bit external address bus. The high order bits of the desired address are placed on the address bus 30 first and latched by the A and B port address latches 32 and 34. The lower order bits of the address are then placed on the address bus 30 and the entire sixteen bit address is clocked into the A and B port address counters 36 and 38 when the LAA and LAB inputs are activated.

In operation, a two phase (A/B) clock signal is supplied to an A/B phase FF which is coupled to A and B port address MUX units 40 and 42 and A and B port data MUX units 48 and 50. During the A phase of the clock signal, SRAM array 44 is connected to the A port address counter 36 via the address MUX unit 40 and the A port 2-word FIFO 52 via the data MUX unit 48 and SRAM array 46 is connected to the B port address counter 38 via the address MUX unit 42 and the B port 2-word FIFO 54 via the data MUX unit 50. The above-described connections are reversed during the B phase of the clock. The operation of the 2-word FIFOs 52 and 54, as well as the Up/Down Flag Counter 60, will be discussed in greater detail at a later point below.

The control of the address MUX units 40 and 42 as described above provides interleaving access to the SRAM arrays 44 and 46 via the A and B ports. One access per clock cycle for each port can therefore be achieved if the incrementation of the A port address counter 36 and the B port address counter 38 is properly synchronized to the A/B clock phases. For example, if the A port address counter 36 is at an even address during phase A, it will be at an odd address during phase B. The A port address counter 36 will then track the connection pattern of the SRAM arrays 44 and 46 allowing sequential access on each clock in a burst access mode.

The BAM can also be addressed in a random access mode of operation. In general, random access to dual-port RAM arrays requires three clock periods: one to load a given address counter, one for the actual access, and one to allow for the probability that the RAM array is being connected to another port. By waiting three clock periods, each port appears to have simultaneous access to the same memory, i.e., apparent simultaneous dual-port access.

Random access in two clock periods instead of three for a given port is possible, however, if the other port is not in use at the time of access time. In such a case, the A/B phase FF 56 illustrated in FIG. 2 is used to eliminate the cycle required to allow for the probability that one of the SRAM arrays 44, 46 is connected to another port. More specifically, the A/B phase FF in the embodiment illustrated is forced to the phase of the least significant bit of the input address.

Figure 3:
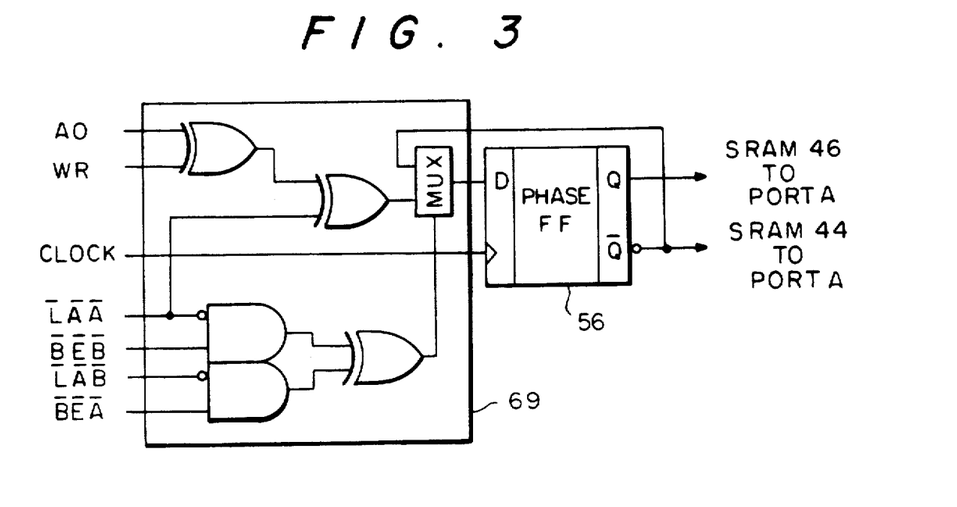
FIG. 3 is a schematic block diagram of a flip-flop control circuit employed in the BAM illustrated in FIG. 2.

A FF logic circuit 69, which forms part of the control logic circuit 58 for controlling the operation of the A/B phase FF 56, is illustrated in FIG. 3. The outputs of the A/B phase FF 56 are used to control the operation of the address MUXs 40 and 42 and the data MUXs 48 and 50. More specifically, one output is used to control the MUXs to connect the A port to SRAM array 44 and the B port to SRAM array 46, while the other output is used to control the MUXs to connect the A port to SRAM 46 and the B port to the SRAM 44.

Figure 4:
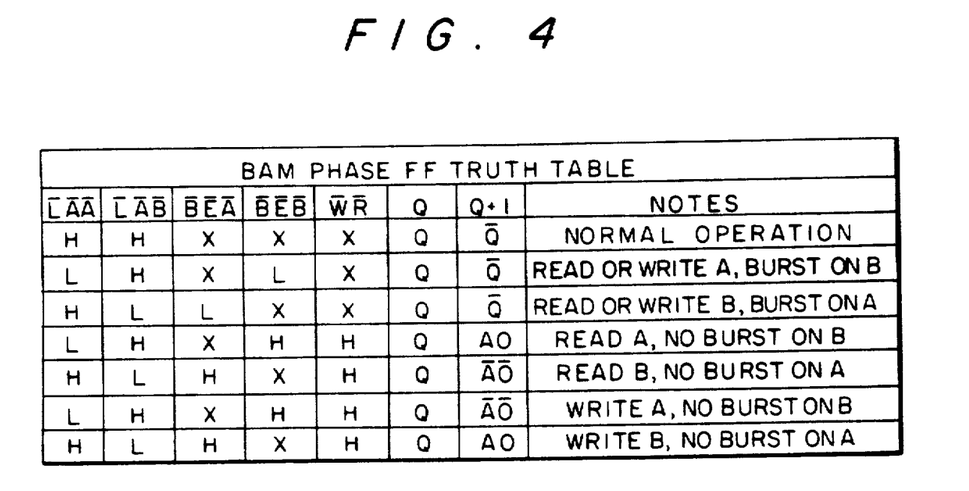
FIG. 4 is a truth-table for the flip-flop control circuit illustrated in FIG. 3.

The FF logic circuit 69 operates as follows: the LAA signal sets the Phase FF 56 so that the A port will have the correct SRAM on the next cycle, the Read signal sets the Phase FF 56 to A0 so desired data will come out on the next cycle, the Write signal with BEA not active sets the Phase FF 56 to A0 so data can be written on the cycle subsequent to the next cycle (i.e., the next+1 cycle); and LAB sets the Phase FF 56 so that the B port will have the correct SRAM on the next cycle, the Read signal sets the Phase FF to A0 so desired data will come out on the next cycle, and the Write signal with BEA not active sets the Phase FF to A0 so data can be written on the next+1 cycle. A truth table illustrating the operation of the FF logic circuit 69 is illustrated in FIG. 4.

The interleaving architecture described above can allow one access per clock cycle for sequential transfers. Further, sequential transfers at one access per clock cycle can be performed simultaneously on both ports with one port performing a transfer operation to an odd address while the other performs a transfer operation to an even address, as long as the address counter for the respective ports remains synchronized to the A/B clock phase. This can cause difficulties when stopping sequential access after a single or odd number of clock pulses. If access is stopped for one cycle and a restart is attempted, synchronization will be lost and the system will have to wait one clock cycle to resynchronize. Synchronization is maintained for an even number of cycles without difficulty.

The synchronization problem is overcome by the use of the 2-word reversible FIFOs 52 and 54 illustrated in FIG. 2. The FIFOs 52 and 54 are located between a given data port and the external data busses 53 and 55. The FIFOs 52 and 54 absorb an extra word during a one cycle reading stop and supply this word during the resynchronization clock cycle. If a longer stop is needed, the FIFOs 52 and 54 can first be filled to permit two-cycle internal stops as required.

Figure 5:
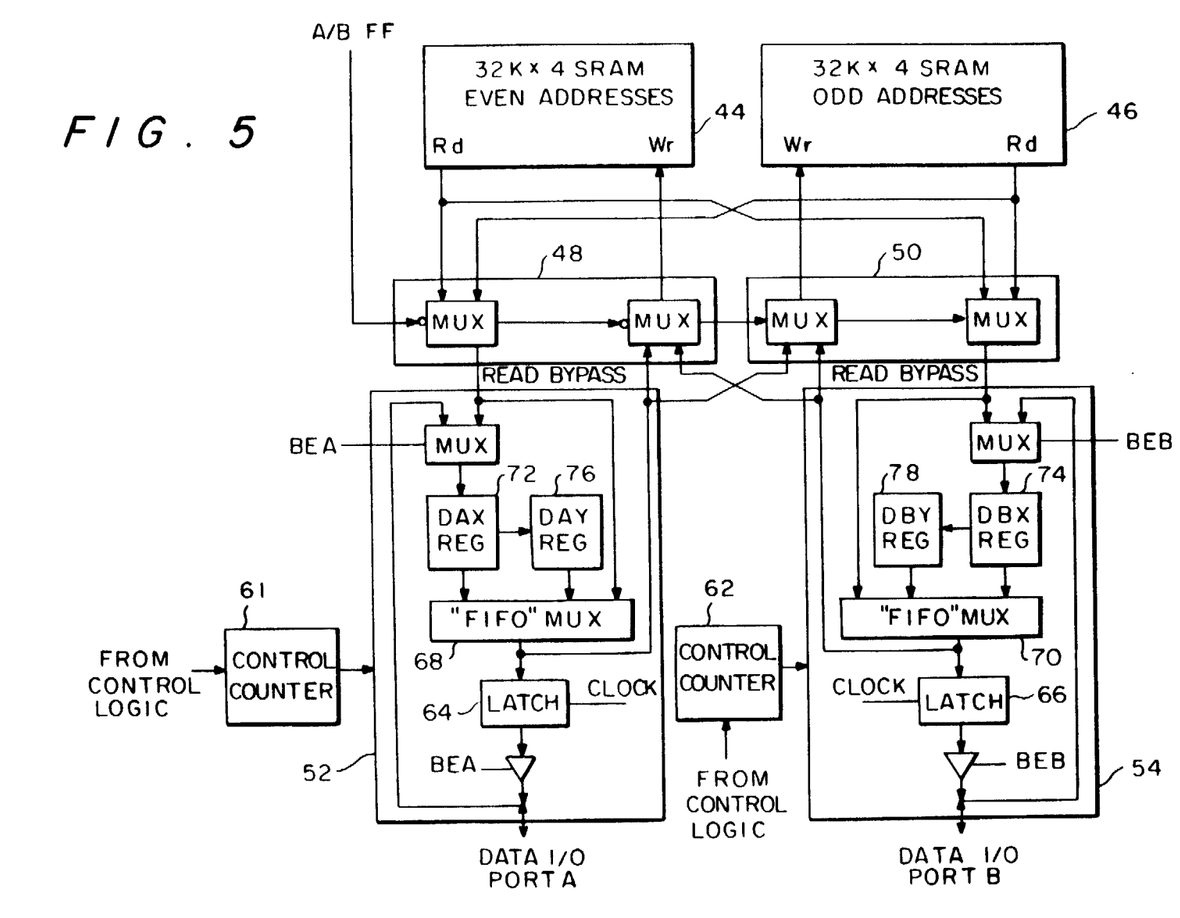
FIG. 5 is a schematic block diagram of 2-word FIFOs employed in the BAM illustrated in FIG. 2.
Figure 6:
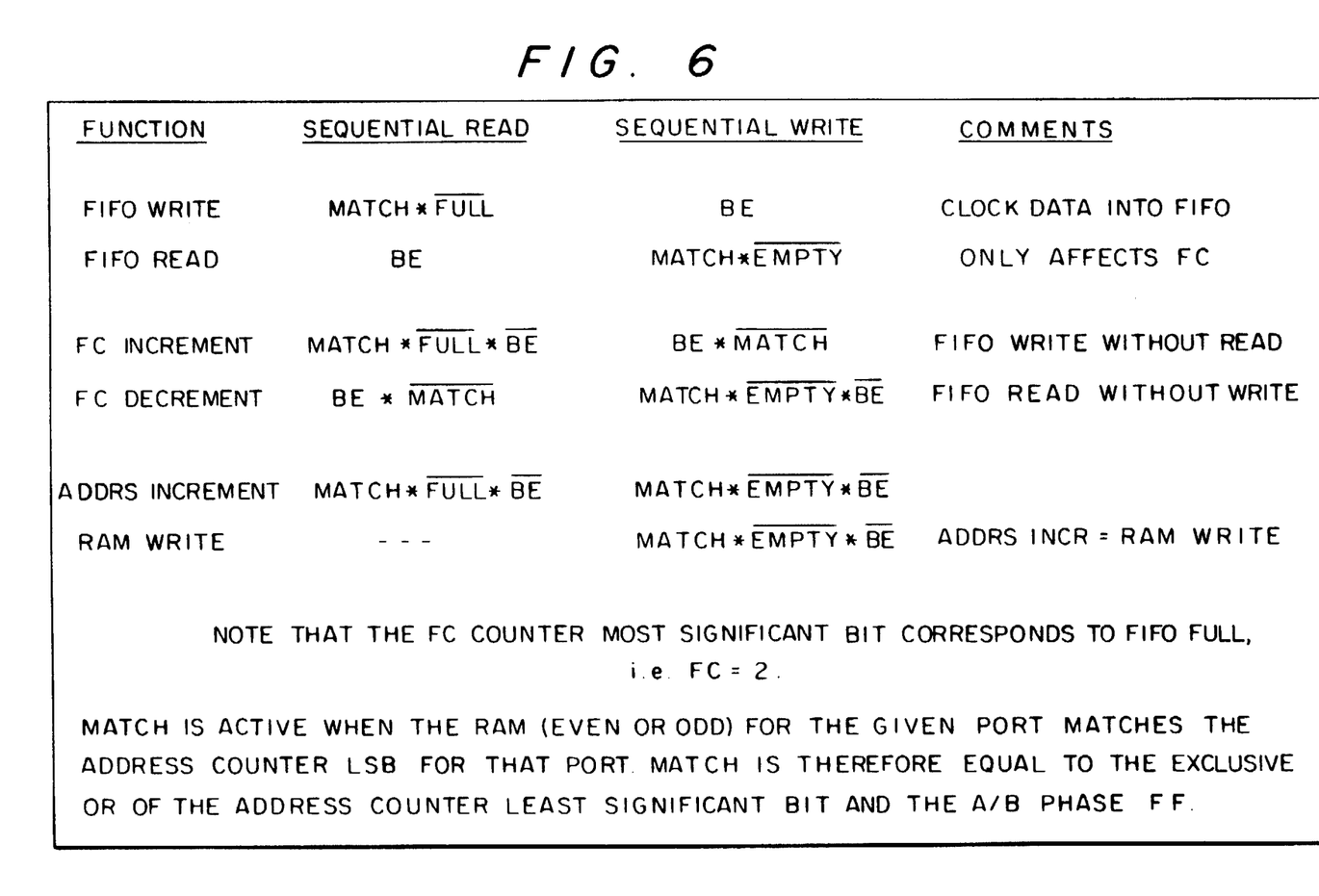
FIG. 6 is a table illustrating the control logic conditions for the 2-word FIFOs.

A detailed block diagram of the 2-word FIFOs 52 and 54 and their connection to the SRAM arrays 44 and 45 is illustrated in FIG. 5. The 2-word FIFOs 52 and 54 are controlled by two-bit FIFO control (FC) counters 61 and 62 formed of a pair of flip-flops, which control the writing and reading operation of FIFO latches 64, 66; FIFO MUXs 68, 70; DAX and DBX registers 72 and 74; and DAY and DBY registers 76 and 78.

Each FIFO control counter is reset to 0 when its address counter is loaded at the beginning of a direct access and it is set to 1 at the beginning of a direct access write with burst enable active on its own port and inactive on the opposite port. This allows the address and data to be clocked in at the same cycle and allows continuous chains of direct access writes. The FIFO control counters 61 and 62 are empty when the counter value is 0 and full when it is 2.

When the count in a given FIFO control counter is zero, its associated 2-word FIFO is set to allow data to flow through. The allows access at the end of the second cycle in a read mode. When the count in a given FIFO control counter is one, its associated DX register (either DAX register 72 or DBX register 74) is selected; when the count is two the associated DY register (either DAY register 76 or DBY register 78) is selected. Thus, the count in a given FIFO control counter of zero, one and two provide corresponding delays of zero, one and two clock cycles for its respective port.

In a burst read mode of operation, a given 2-word FIFO is written into if the FIFO is not full whenever there is a match between the LSB of the address counter associated with its port and the signal received by the port from the phase FF 56. This comparison is made by circuitry not illustrated in the diagram. A given 2-word FIFO is read whenever the burst enable input is active.

In burst write mode, a given 2-word FIFO is written whenever the burst enable is active. It is read if it is not empty, whenever there is a match between the LSB of its ports associated address counter and the signal received from the phase FF 56.

Each FIFO control counter is incremented whenever its associated 2-word FIFO is being written without being read, and is decremented whenever its associated 2-word FIFO is being read without being written. The count remains unchanged if the 2-word FIFO is simultaneously being written and read.

Figure 7:
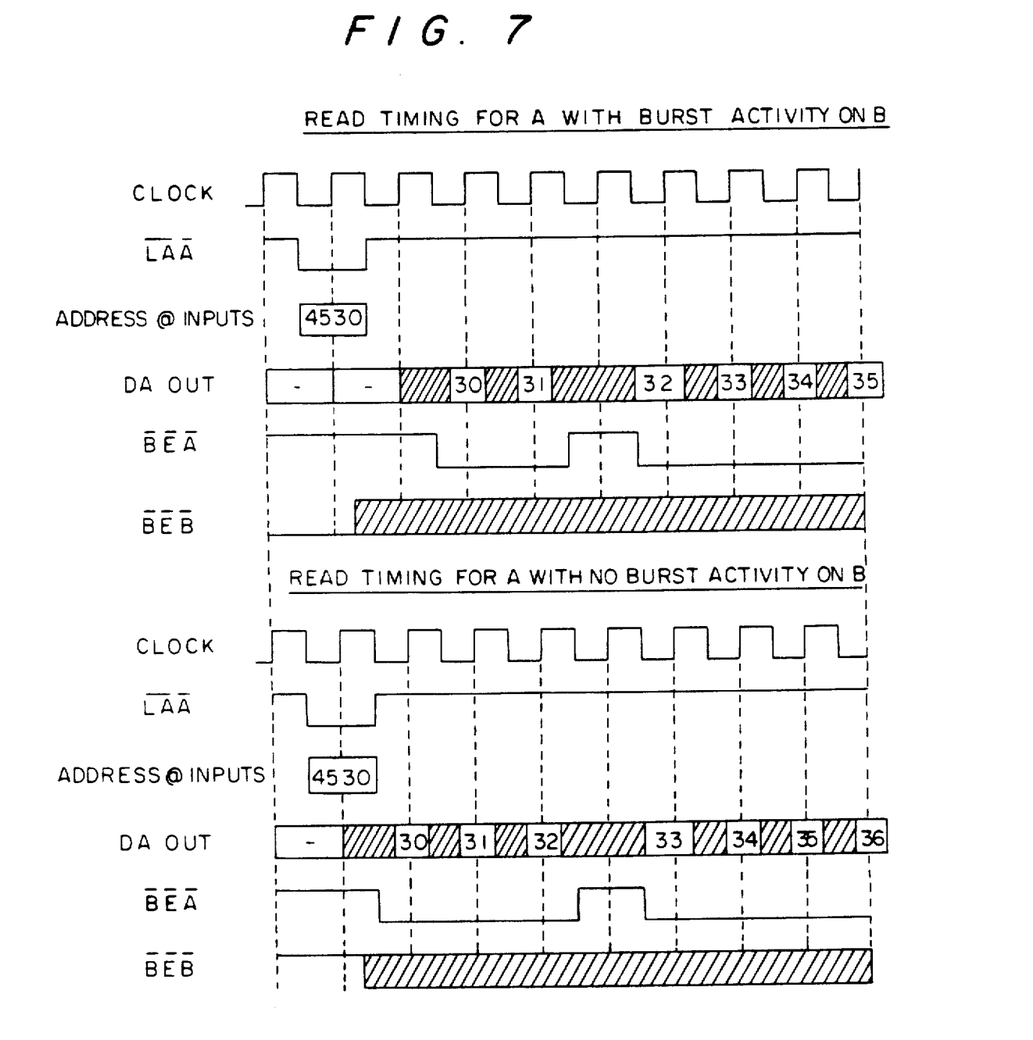
FIG. 7 illustrates read timing diagrams.
Figure 8:
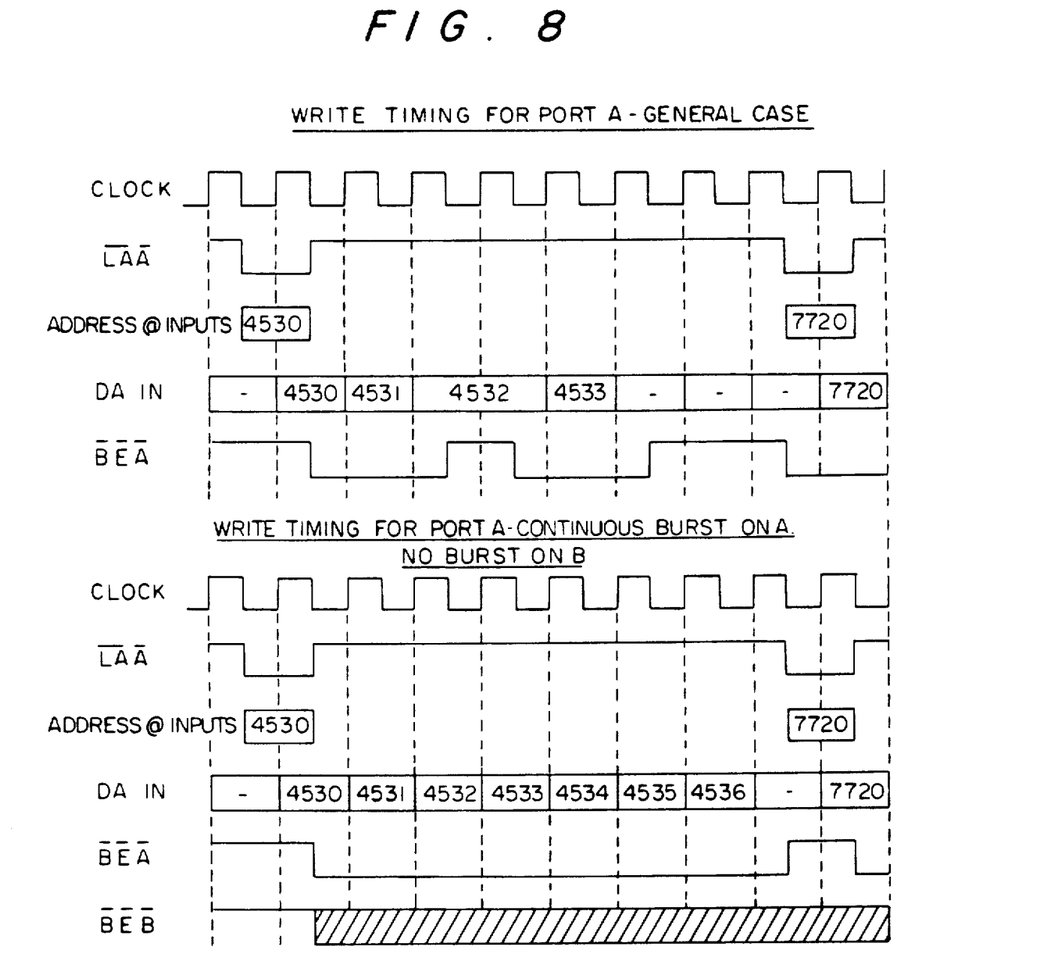
FIG. 8 illustrates write timing diagrams.
Figure 9:
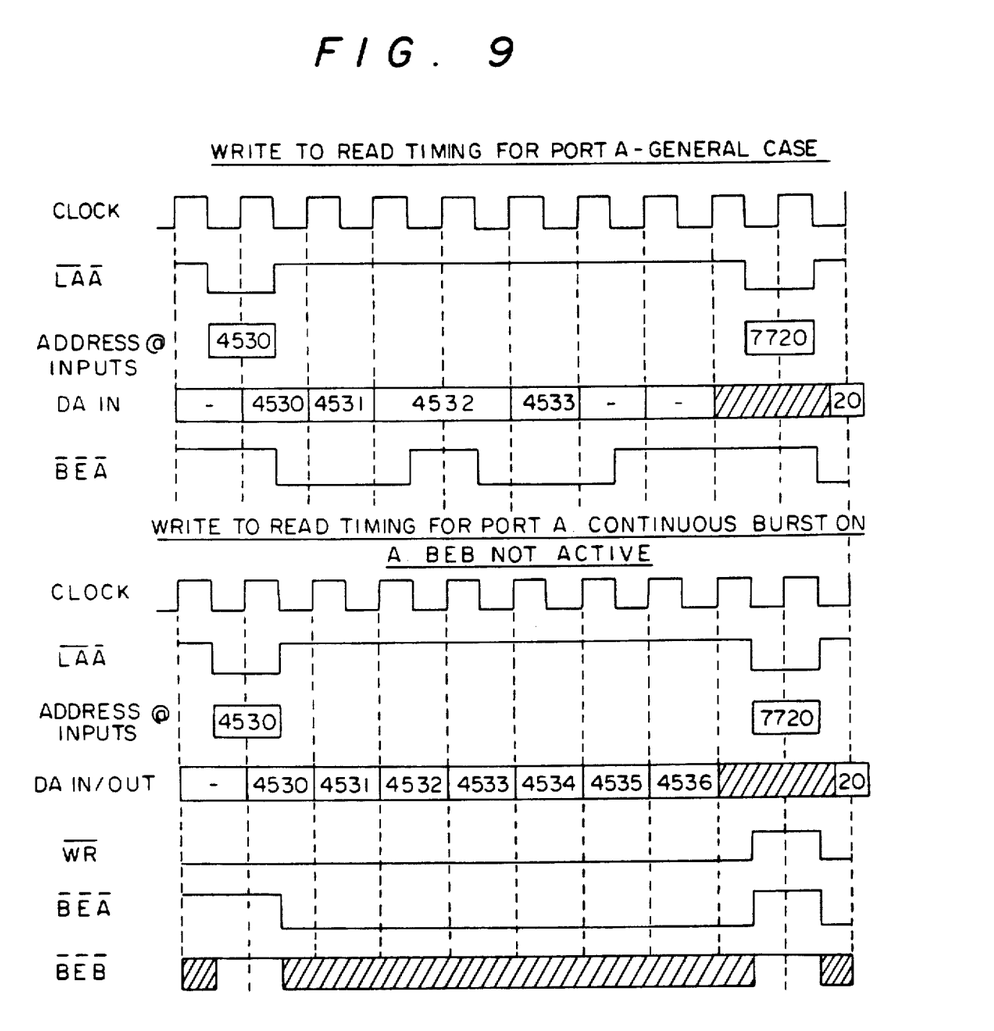
FIG. 9 illustrates timing diagrams for a write operation followed by a read operation.
Figure 10:
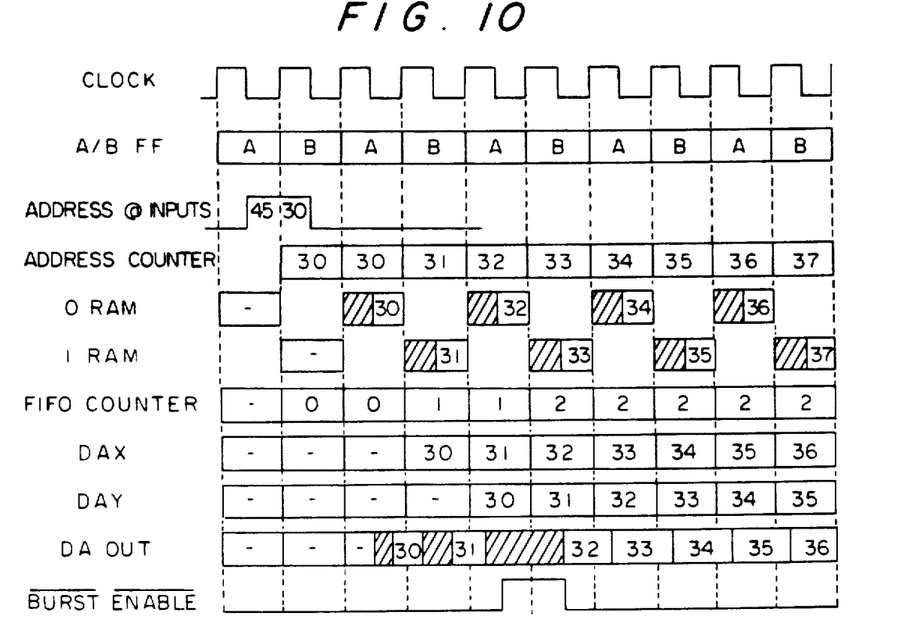
FIG. 10 is a read timing diagram.
Figure 11:
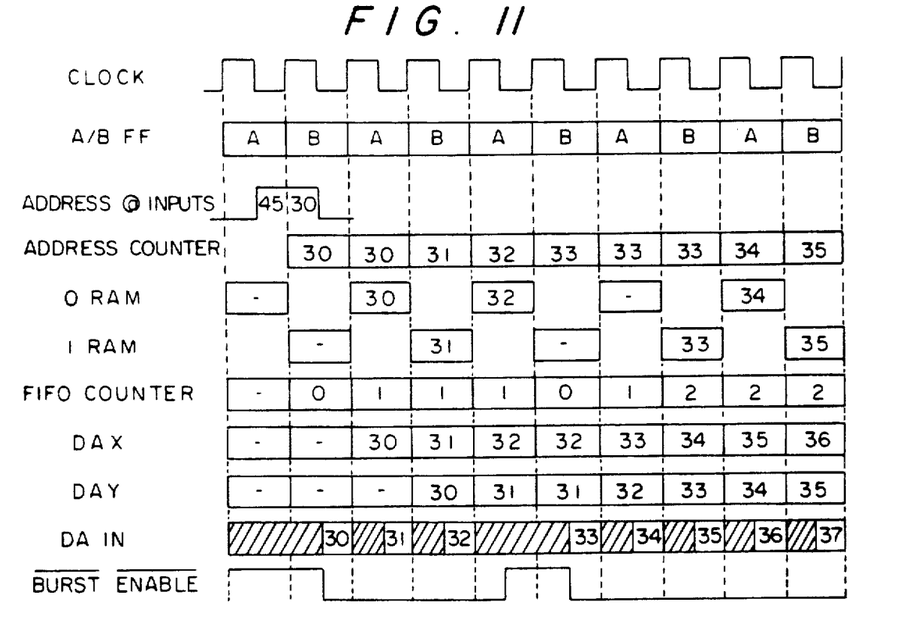
FIG. 11 is a write timing diagram.
Figure 12:
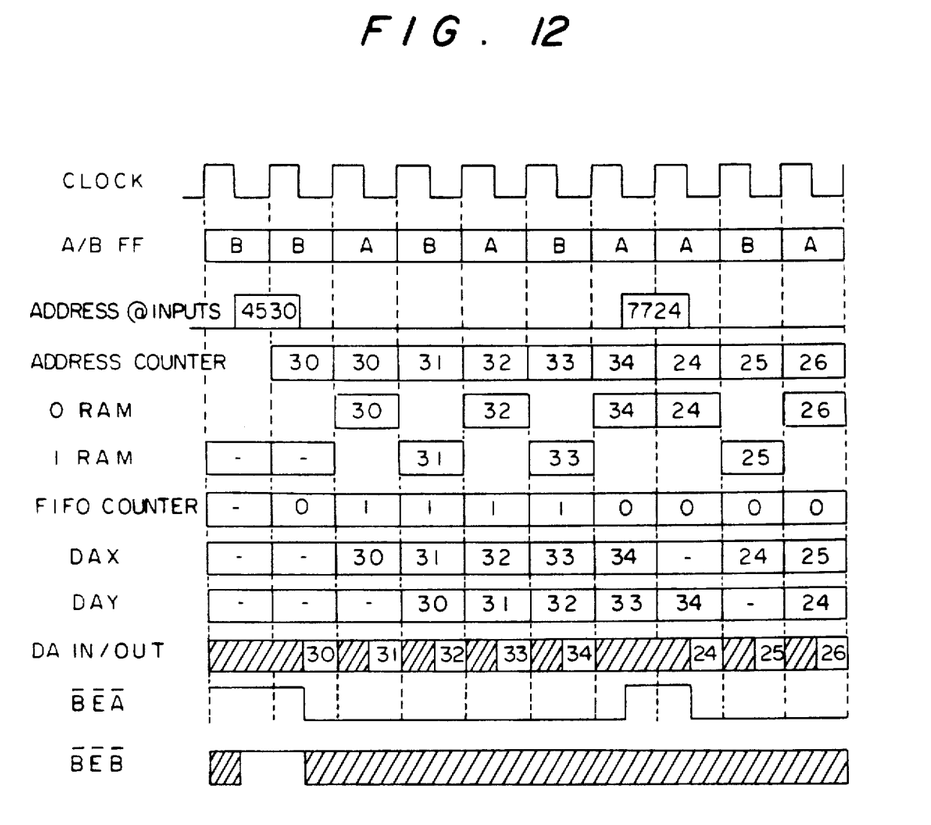
FIG. 12 is a write-to-read timing diagram.

Various timing diagrams illustrating the operation of the BAM are shown in FIGS. 7-12. FIGS. 7, 8 and 9 illustrate timing diagrams for read, write and write followed by a read, respectively. The Phase FF and FIFO logics function are included in these diagrams. The read diagrams shown normal and fast access and one cycle of stall in burst mode. The write timing diagrams show write timing for the general case and for the continuous write burst case with no burst activity on the other port. In the general case, it takes 2 cycles to clear the FIFO before beginning another random access write or read. In the continuous burst case with no burst activity on the other port, a 2 cycle wait is not required as the FIFOs never fill: they are emptied as fast as they are filled. To achieve write continuous burst, BEA must be activated in the first cycle after LAA and must be kept active until the next LAA as shown. FIGS. 10 and 11 respectively illustrate read and write operations for direct access and sequential access with one cycle stall, assuming the worst case of burst activity on the other port and the Phase FF coming up in the wrong phase for immediate access. FIG. 12 illustrates write-to-read operations for continuous burst write. The Phase FF is set to A0 for both the write and read case.

It is noted that the above described BAM can also be implemented as a 64K × 4, 50 MHz synchronous FIFO which is reversible in direction with the use of the 16-bit Up/Down Flag counter 60 illustrated in FIG. 2. A reset input to the control logic 58 is used to clear both address counters 36 and 38 and the flag counter 60 to zero. A detailed block diagram of the Up/Down Flag counter 60 is provided in FIG. 13.

Figure 13:
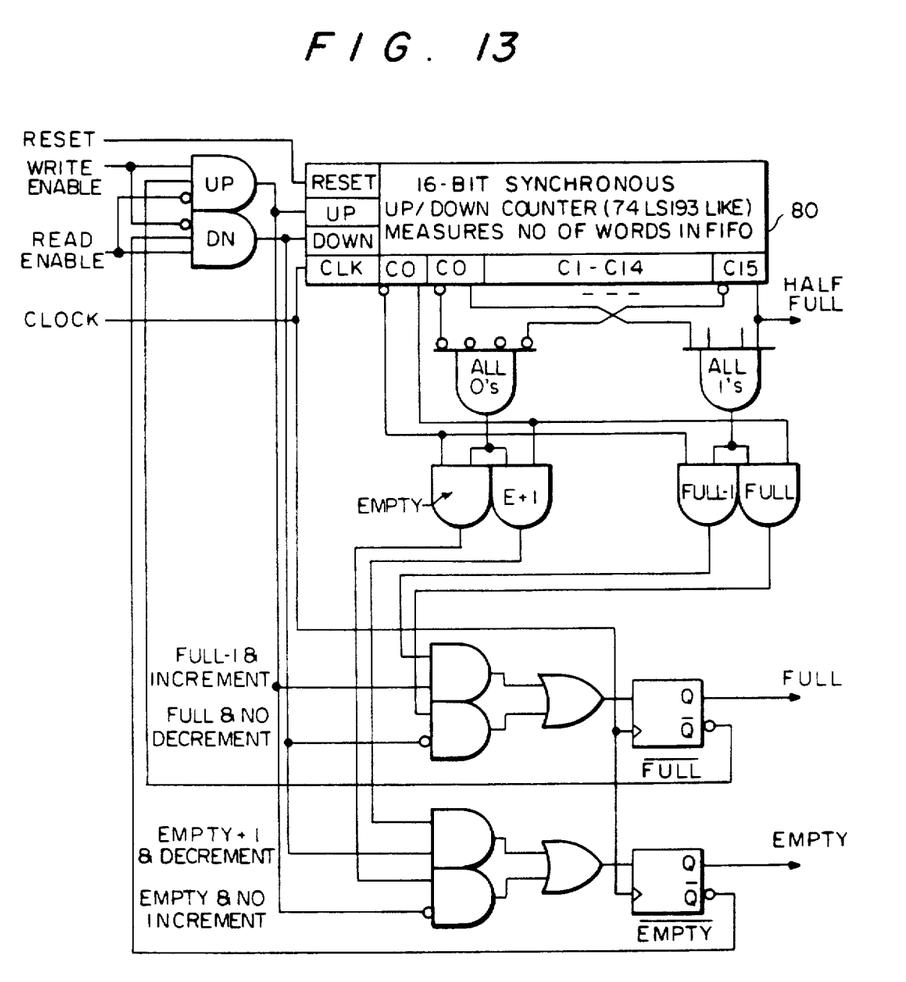
FIG. 13 is a schematic diagram of FIFO flag logic employed in the embodiment illustrated in FIG. 2.

Since the BAM is run by a single clock, the Up/Down Flag Counter 60 incorporates a simple up/down counter 80 which either increments, decrements, or holds on each cycle depending on whether a write operation, read operation or simultaneous write or read operations are (or are not) performed, respectively. The empty flag is activated when the value contained in the counter 80 is zero and the 2-word read FIFO counter is zero, and the full flag is activated when the counter 80 is all-ones and the write 2-word FIFO counter is full. The half full flag is the most significant bit of the Up/Down Flag counter 60.

Figure 14:
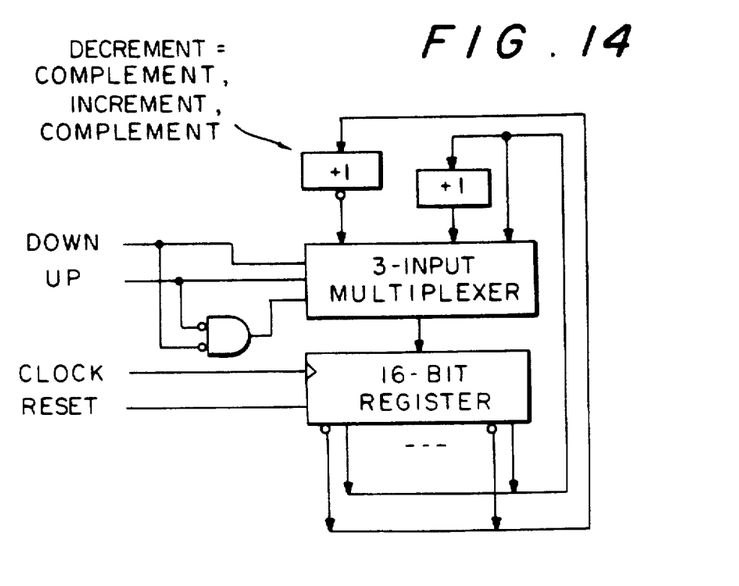
FIG. 14 is a schematic block diagram of a counter employed in the flag logic illustrated in FIG. 13.
Figure 15:
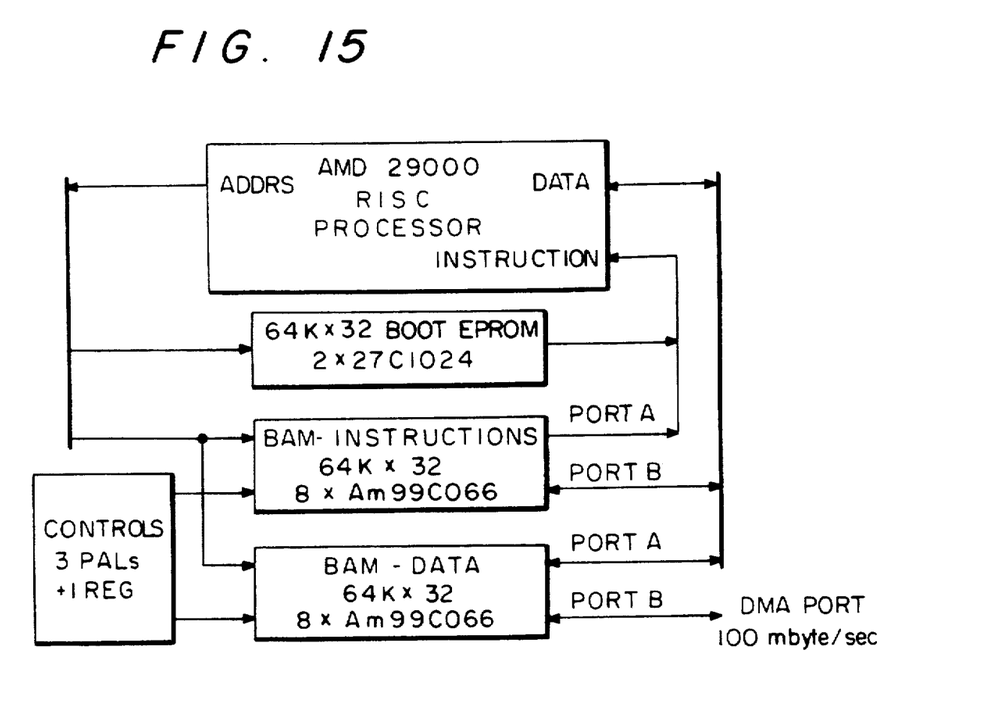
FIG. 15 is a schematic block diagram of the implementation of BAMs with a processor.

A logic diagram for the 16 bit up/down counter 80 is shown in FIG. 14. It is similar in operation to a 74LS191 and 74LS169 counter. the up/down counter 80 includes incrementors 82 and 84, a multiplexer 86 and a register 88. The up/down counter 80 increments by loading the incremented value of the current count and decrements by loading the decremented value. If no increment or decrement is required, the up/down counter 80 loads its current value (i.e., holds the current count).

The counter decrement function is actually implemented by using an incrementer 82. The incrementer 82 is connected to the complement output of the register 88, and the incrementer output 82 is inverted before being applied to the multiplexer 86. This is equivalent to complementing the count, incrementing the complemented value, and recomplementing the result, which is equivalent to a decrement operation.

As described above, the invention provides a BAM having the following advantages: the BAM can transfer sequential data in a burst access mode on either or both ports simultaneously at a rate of one word per clock pulse, either or both ports of the BAM can be used for random or burst access operations, and burst mode access on either port can be stopped for one or more clock cycles and then resumed.

Figure 16:
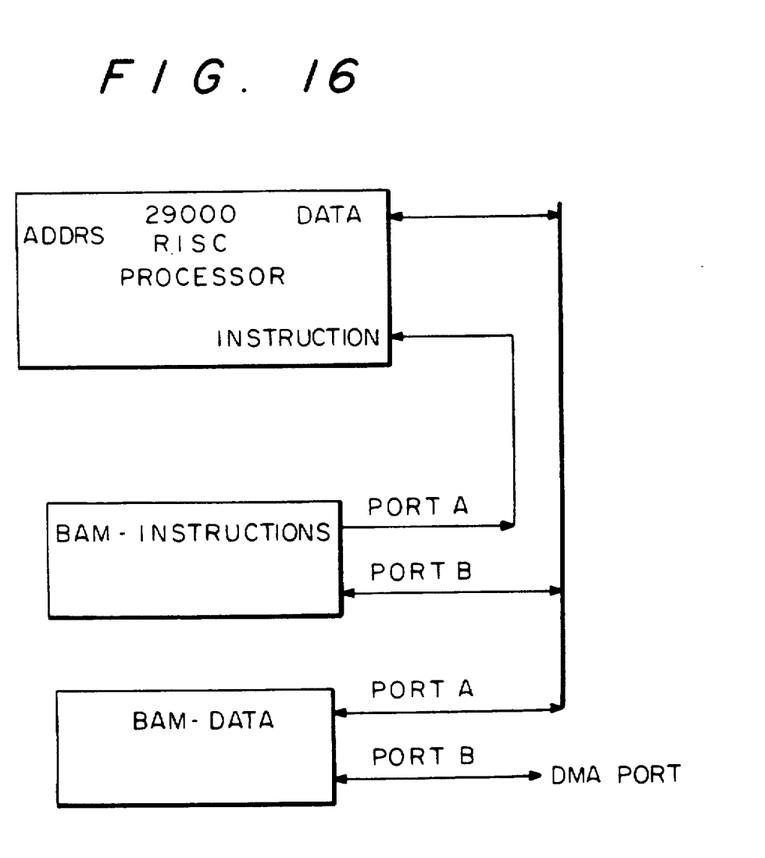
FIG. 16 illustrates the use of separate banks of BAM for instruction and data to provide both higher performance and a high speed DMA channel in a processing application.

The BAM is also capable of operating at clock rates of 50 MHz making it particularly useful in design applications using high-speed processors such as the AMD 29000 RISC processor. For example, FIG. 16 illustrates the use of separate banks of BAM for instruction and data to provide both higher performance and a high speed DMA channel. The instruction BAM is connected to both the instruction and data buses of the processor. This allows the processor to access the instruction BAM through the data bus to read instruction constants, etc. The data BAM is connected only the data bus of the processor. This allows three cycle access to data in most cases. The second port of the data BAM can be used as a direct memory access port. This permits 100 mbyte/sec DMA on a 25 MHz 29000 processor system with no added logic other than a word counter.

The invention, however, is not limited to the specifically disclosed embodiments. Modifications and variations are possible within the scope of the amendment claims. For example, the type and size of the memory arrays can be varied, modifications can be made to the architecture of the address and data busses, and the specifically disclosed logic circuits can be structurally modified to perform the same function.

I claim:

1. An apparatus comprising:
   first and second address counters;
   addressing means for loading address values into said first and second address counters;
   first and second memory arrays;
   address multiplexing means for selectively applying the address values loaded in said first and second address counters to said first and second memory arrays and to supply address values to said first and second memory arrays simultaneously;
   first and second reversible FIFOs;
   first and second data ports, connected to said first and second reversible FIFOs respectively.
   data multiplexing means for selectively connecting said first and second reversible FIFOs simultaneously to said first and second memory arrays;
   control means for controlling the operation of said first and second reversible FIFOs and said data multiplexing means to supply data words from said first and second reversible FIFOs to said first and second memory arrays in a write access mode of operation, and to selectively supply data words stored in said first and second memory arrays to said first and second FIFOs in a read access mode of operation, and to simultaneously supply data words to and from said memory arrays during write access mode and read access modes, respectively, and to synchronize addressing said first and second memory arrays utilizing said FIFOs; and
   wherein said first and second data ports transfer data words simultaneously when said first and second data ports are in a burst mode.

2. An apparatus as claimed in claim 1, further comprising means for sequentially incrementing said first and second address counters simultaneously in a burst mode of operation.

3. An apparatus as claimed in claim 1, further comprising a flag counter controlled by said control means, wherein said flag counter is incremented by said control means when a write operation is performed and a data word is stored in at least one of said first and second memory arrays, and said flag counter is decremented by said control means when a read operation is performed and a data word is read in from at least one of said first and second memory arrays.

4. An apparatus as claimed in claim 1 wherein said memory arrays are interleaved such that one memory array contains odd addresses and the other memory array contains even addresses.

5. An apparatus as claimed in claim 1, wherein one of said ports can be in burst mode while the other port is in random access mode.

6. An apparatus comprising:
   first and second address counters which are incremented in accordance with a clock cycle during a burst mode of operation;
   addressing means for loading address values into said first and second address counters;
   first and second memory arrays wherein said first array contains even addresses and said second array contains odd addresses;
   first and second data ports, corresponding to said first and second address counters, said data ports capable of being simultaneously active in said burst mode of operation, and said data ports each transferring one data word per clock cycle while simultaneously active in said burst mode;
   address multiplexing means for applying, during burst mode access, even address values from said first and second address counters to said first memory array and to supply odd address values from said first and second address counters to said second memory array, said multiplexing means supplying even and odd addresses to said first and second arrays simultaneously,
   synchronization means connected between said memory arrays and said data ports, for maintaining even and odd address synchronization between said data ports when burst mode access is stopped and then restarted on one of said data ports, thereby minimizing delay on restart.

7. An apparatus as claimed in claim 6, further comprising means for sequentially incrementing said first and second address counters in a burst mode of operation.

8. An apparatus as claimed in claim 6, further comprising a flag counter controlled by a control means, wherein said flag counter is incremented by said control means when a write operation is performed and a data word is stored in at least one of said first and second memory arrays, and said flag counter is decremented by said control means when a read operation is performed and a data word is read in from at least one of said first and second memory arrays.

9. An apparatus as claimed in claim 6 further comprising a phase means for controlling a odd and even phase of said apparatus, and providing a phase signal indicating said phase.

10. An apparatus as claimed in claim 9, wherein said synchronization means comprises first and second reversible FIFOs, corresponding to said first and second data ports respectively.

11. An apparatus as claimed in claim 10, wherein said synchronization means further comprises:

data multiplexing means for selectively connecting said first and second reversible FIFOs simultaneously to said first and second memory arrays;

control means for controlling the operation of said first and second reversible FIFOs and said data multiplexing means to supply data words from said first and second reversible FIFOs to said first and second memory arrays in a write access mode of operation, and to selectively supply data words stored in said first and second memory arrays to said first and second FIFOs in a read access mode of operation, and to simultaneously supply data words to and from said memory arrays during write access mode and read access modes, respectively.

12. An apparatus as recited in claim 11 wherein each of said FIFOs include a first and second register.

13. An apparatus as recited in claim 12 wherein said synchronization means includes a control counter for each of said FIFOs.

14. An apparatus as claimed in claim 13, wherein for each FIFO, in read mode, when said control counter is zero, said synchronization means selects data to flow through said FIFO to said corresponding data port from said first and second arrays, bypassing said first and second registers, when said control counter is one, said synchronization means selects data to flow to said corresponding data port from said first register, and when said control counter is two, said synchronization means selects data to flow to said corresponding data port from said second register.

15. An apparatus as claimed in claim 14 wherein said FIFO is written whenever a burst enable signal is active during write mode, said signal indicating a corresponding port is in burst mode.

16. An apparatus as claimed in claim 15 wherein said FIFO is written during read mode whenever said FIFO is not full and there is a match between said phase signal and the least significant bit (LSB) of the address counter corresponding to the port corresponding to said FIFO.

17. An apparatus as claimed in claim 10, wherein one of said ports transfers data in burst mode while the other port is in random access mode.

18. An apparatus comprising:

first and second address counters which are incremented in accordance with a clock cycle during a burst mode of operation;

addressing means for loading address values into said first and second address counters;

first and second memory arrays wherein said first array contains even addresses and said second array contains odd addresses;

first and second data ports, corresponding to said first and second address counters, said data ports capable of being simultaneously active in said burst mode of operation, and said data ports each transferring one data word per clock cycle while simultaneously active in said burst mode;

address multiplexing means for applying, during burst mode access, even address values from said first and second address counters to said first memory array and to supply odd address values from said first and second address counters to said second memory array, said multiplexing means supplying even and odd addresses to said first and second arrays simultaneously;

synchronization means connected between said memory arrays and said data ports, for maintaining even and odd address synchronization between said data ports when burst mode access is stopped and then restarted on one of said data ports, thereby minimizing delay on restart;

said synchronization means comprising first and second reversible FIFOs, corresponding to said first and second data ports respectively;

a phase means for controlling an odd and even phase of said apparatus, and providing a phase signal indicating said phase; and wherein one of said ports transfers data in a burst mode while the other port is in a random access mode.

* * * * *